United States Patent [19]

Thörnell

[11] 4,342,063
[45] Jul. 27, 1982

[54] MEMORY CIRCUIT IN A RELAY PROTECTION DEVICE

[75] Inventor: Lennart Thörnell, Västeros, Sweden

[73] Assignee: ASEA Aktiebolag, Västeros, Sweden

[21] Appl. No.: 184,543

[22] Filed: Sep. 5, 1980

[30] Foreign Application Priority Data

Sep. 7, 1979 [SE] Sweden ............................ 7907436

[51] Int. Cl.³ ........................ H02H 3/38; H02H 3/24
[52] U.S. Cl. ...................................... 361/79; 361/85; 361/86; 364/483
[58] Field of Search .................. 361/79, 80, 81, 82, 361/84; 364/119, 480, 483, 481; 340/146.3 AC

[56] References Cited
U.S. PATENT DOCUMENTS 3,569,785  3/1971  Durbeck et al. ..................... 361/80
3,723,864  3/1973  Ricard .............................. 361/80 X Primary Examiner—Patrick R. Salce
Attorney, Agent, or Firm—Watson, Cole, Grindle & Watson

[57] ABSTRACT

The invention relates to a memory circuit in a relay protection device with a phase-locked loop, a monitoring circuit and an updating circuit. When a fault detector, a phase-change detector and/or an amplitude-change detector monitoring an a.c. network to which the protection device is connected supply an output signal indicative of a fault in the network, no updating of a storing member in the loop takes place.

8 Claims, 1 Drawing Figure

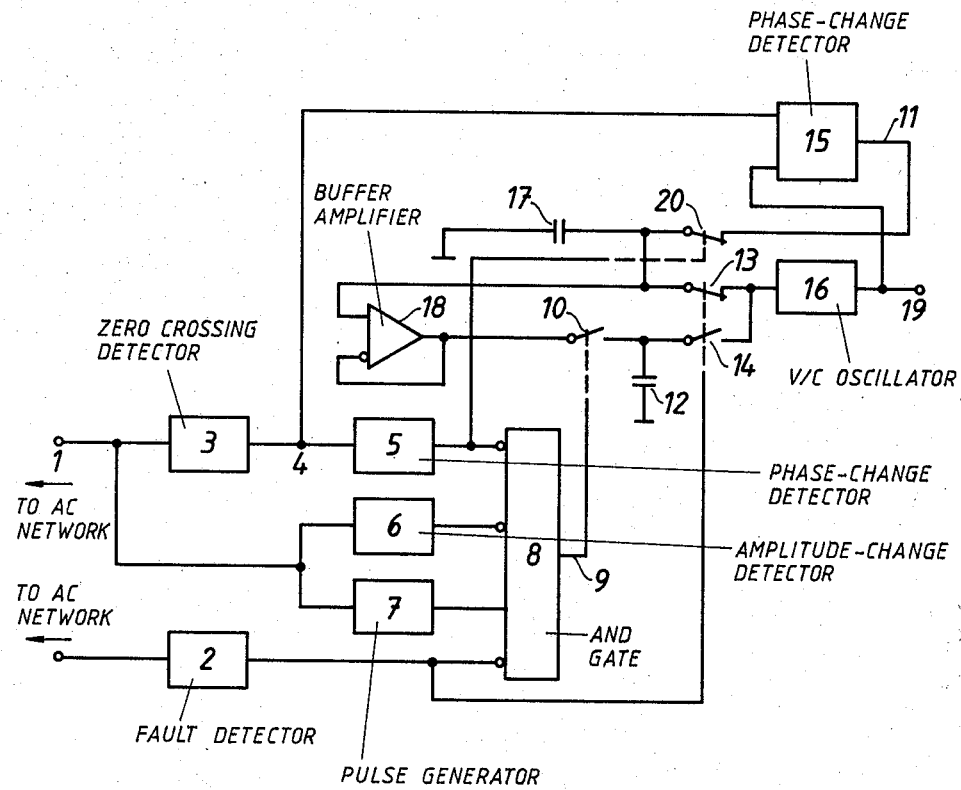

MEMORY CIRCUIT IN A RELAY PROTECTION DEVICE

TECHNICAL FIELD

The invention relates to a memory circuit in a relay protection device for an a.c. network which protection device has a phase-locked loop, a monitoring circuit and an updating circuit.

To be able to determine the direction of an adjacent fault in a three-phase a.c. network, the appearance of the signal prior to the occurrence of the fault must be known. To obtain that signal, a memory circuit is used. A requirement of such a memory circuit is that it must remember a prior signal for a sufficiently long time, and to accomplish this it must be rapidly disconnected from the input signal when a fault occurs in the a.c. network being supervised.

BACKGROUND ART

The most commonly used type of memory circuit in a relay protection device is a resonance circuit, active or passive, tuned to the rated frequency. This type of memory circuit has two disadvantages. Firstly it has a poor memory when it comes to remembering for a long period of time, and secondly it has to be pre-set to a rated frequency, which may differ a few percent from the operating frequency of the network just prior to the fault occurring. This difference in frequency affects the operating characteristic of the protection device and may, in the worst case, result in a malfunction. The dependence of the memory circuit on the frequency of the network also makes it necessary to retune the memory circuit upon a change in the rated frequency of the network. This results in increased costs of production. To avoid the problems associated with the frequency dependence of resonant circuits, a phase-locked loop may be used for the memory circuit. The great problem in connection with using a phase-locked loop is to rapidly disconnect the feedback signal when the phase position of the input quantity being used to monitor the supervised network changes, so that the output signal is not affected.

DISCLOSURE OF THE INVENTION

The invention aims to provide a solution to the above problems and other problems connected therewith.

According to the invention, a relay protection device comprising a memory circuit having a phase-locked loop for supplying an output signal, the frequency and phase position of which output signal correspond to the frequency and phase position of an input signal supplied to the memory circuit, said input signal being adapted to be supplied to the memory circuit from an a.c. network and the value of said input signal corresponding to an operating quantity of the network, said memory circuit also comprising a member for storing a quantity which corresponds to the present frequency of the operating quantity and a member for periodically updating the storing member, is characterised in that the updating member effects updating of the storing member only when a fault detector and a phase change detector for the a.c. network do not supply a respective output signal which indicates a fault and a phase change in the network.

An advantage of the invention is that updating of the memory circuit only takes place if the monitored network is faultless. Thus the output signal from the memory circuit is always well-defined and is always independent of a fault on the network.

BRIEF DESCRIPTION OF DRAWING

The invention will now be further described, by way of example, with reference to the accompanying drawing, the single FIGURE of which shows one embodiment of memory circuit according to the invention.

DESCRIPTION OF PREFERRED EMBODIMENT

Referring to the drawing, an analog input signal 1, derived from the network being supervised, (e.g. the polarization voltage) is fed to the memory circuit. This input signal is squared in a zero crossing detector 3. An output signal 4 from the detector 3 is fed to a phase-change detector 15, which generates a pulse train signal 11 on its output when the signal 4 and a further signal 19 have different phases. The signal 19 represents the output signal from a voltage-controlled oscillator 16. The signal 11 is fed to a capacitor 17, via a normally-closed contact 20. The capacitor 17 integrates the signal 11. This integrated signal is used as an input signal to the oscillator 16 via a normally-closed contact 13. In order rapidly to disconnect the capacitor 17 from the signal 11, the contact 20 is controlled from a second phase-change detector 5, which is of the same type as the detector 15. The output signal 4 from the zero crossing detector 3 is also passed, via the phase-change detector 5, to an inverted input of an AND gate 8. To a further inverted input of the gate 8, there is also supplied a signal via an amplitude-change detector 6. A fault detector 2 connected to the supervised network supplies a signal to a still further inverted input of the AND gate 8 and a device 7 supplies a short pulse to a normal input of the gate 8 after each peak of the input signal 1. When the pulse from the device 7 arrives at the gate 8, its output 9 becomes "high" and acts to close a normally-open contact 10. A capacitor 12 is then charged to the same value as the capacitor 17 via a buffer amplifier 18. This charging of the capacitor 12 thus takes place provided that the outputs of the devices 2, 5 and 6 are not indicating a fault in the network being monitored. The signal from the fault detector 2 also controls opening of the contact 13 and the closing of a normally-open contact 14 so that, upon the appearance of a fault in the network, the input signal to the oscillator 16 is taken from the capacitor 12.

The phase-change detectors 5 and 15 act more rapidly than the fault detector 2 and thus interrupt the updating of the capacitor 12 before the fault detector 2 has time to react. The phase-change detector 5 supplies a short pulse as its output signal when the phase position of the input signal changes. The amplitude-change detector 6 supplies a short pulse as its output signal when the amplitude of the input signal drops below a certain reference level. This reference level is controlled by the detector itself in dependence on the normal value of the input voltage. The fault detector 2 takes over the blocking of the updating of the capacitor 12 when the pulses from devices 5 and 6 cease. The pulse length of the last-mentioned pulses is thus longer than the operating time of the fault detector 2.

The circuit shown in the drawing can function without the fault detector 2, provided that the output signals from the phase-change detector 5 and the amplitude-change detector 6 are extended by a sufficient amount.

What is claimed is:

1. A relay protection device for supplying a periodic output signal, the frequency and phase position of which correspond to the frequency and phase position of an input signal from an a.c. network, comprising:
   a memory circuit including a phase-locked loop with a voltage-controlled oscillator and a phase comparator;
   means for supplying an input signal from an a.c. network to a first input of said phase comparator, said input signal corresponding to an operating quantity of said network;
   the output signal from said oscillator being connected to a second input of said phase comparator;
   said phase comparator generating an output signal corresponding to the phase difference between the signals supplied to said first and second inputs;
   signal adapting means connected to said phase comparator output for generating a signal corresponding to the present frequency of said operating quantity;
   means for connecting said signal to a control input of said voltage-controlled oscillator;
   said memory circuit further including a storage member, first switching means for connecting said storage member to said signal adapting means for storing in said storage member said signal corresponding to the present frequency of said operating quantity, second switching means for connecting, upon a fault in said network, said storage member to said control input of said voltage-controlled oscillator;
   control means for periodically closing said first switching means to update the signal stored in said storage member, said control means including a fault detector for generating an output signal upon a fault in said network;
   a phase-change detector for generating an output signal upon a change in the phase position of said operating quantity; and
   logical means connected to receive the output signals of said fault and phase-change detectors for preventing the closing of said first switching means when either one or both of said fault and phase-change detectors generate an output signal.

2. A relay protection device according to claim 1, wherein said control means further includes an amplitude detector for generating an output signal upon a change in amplitude of an operating quantity in said a.c. network, means for connecting said output signal to said logical means, and said logical means being arranged to prevent the closing of said first switching means when said amplitude detector generates an output signal.

3. A protection device according to claim 2, in which said amplitude-change detector generates an output signal as soon as the magnitude of the input signal in the succeeding half-period has a lower amplitude than that occurring in the immediately preceding half-period.

4. A protection device according to claim 1 or claim 2, in which said fault detector is adapted to supply a signal for the entire time that a fault remains on the a.c. network.

5. A protection device according to claim 2, in which updating of the storing member only occurs when the amplitude of the input signal has passed a peak value and, at the same time has not decreased in amplitude in comparison with the peak value achieved in the immediately preceding half-period.

6. A protection device according to claim 1 or claim 2, in which said phase-change detector has a speed of detection which is at least equal to the corresponding function in the phase-locked loop.

7. A relay protection device according to claim 1, further comprising third switching means for connecting said signal adapting means to the input of said voltage-controlled oscillator, the output signal of said fault detector being connected to said second and third switching means for controlling said switching means upon a fault in said network to disconnect said signal adapting means from the input of said oscillator and to connect said storage member to the input of said oscillator.

8. A relay protection device according to claim 1, further comprising fourth switching means connected to and controlled by the output of said phase-change detector to disconnect said signal adapting means from the output of said phase comparator upon a change in the phase position of said operating quantity.

* * * * *